United States Patent [19]

Ashton

[11] Patent Number: 4,546,348

[45] Date of Patent: Oct. 8, 1985

[54] DUAL CHANNEL CURVE TRACER

[75] Inventor: Robert H. Ashton, Watervliet, Mich.

[73] Assignee: Heath Company, St. Joseph, Mich.

[21] Appl. No.: 498,608

[22] Filed: May 27, 1983

[51] Int. Cl.⁴ .............................................. G09G 100
[52] U.S. Cl. ................................... 340/715; 340/721; 340/722
[58] Field of Search ............... 340/720, 721, 715, 722, 340/798, 799, 805; 371/25, 29; 324/158 D

[56] References Cited

U.S. PATENT DOCUMENTS

| | | | |
|---|---|---|---|
| 2,962,625 | 11/1960 | Berwin et al. | 340/721 |
| 3,254,301 | 5/1966 | McGrath et al. | 324/158 D |
| 3,406,387 | 10/1968 | Werme | 340/722 |
| 3,422,418 | 1/1969 | Simoneau | 340/722 |
| 3,457,507 | 7/1969 | Overtveld | 324/158 D |
| 3,614,614 | 10/1971 | Starliper | 324/158 D |
| 3,781,850 | 12/1973 | Gicca et al. | 340/722 |
| 3,818,474 | 6/1974 | Kurner et al. | 340/721 |
| 4,307,393 | 12/1981 | Hamada et al. | 340/721 |

Primary Examiner—Gerald L. Brigance

[57] ABSTRACT

A system and method for displaying graphic information and comparing this information with reference data on the faceplate of a cathode ray tube (CRT) is disclosed. The graphic information is provided via a first channel and the reference data is provided via a second channel to a multiplexer for the alternating, sequential display of the graphic information and reference data on the CRT. A high frequency oscillator in combination with logic circuitry provides on/off modulation of one of these inputs to the CRT to produce an interrupted, discontinuous display of the thus modulated signal. One set of data is thus displayed as a continuous line, while the other set of data is presented in dotted line form. The present invention is particularly adapted for the presentation of two sets of closely matched data points on a CRT to facilitate the differentiation and identification of each data set.

12 Claims, 5 Drawing Figures

DUAL CHANNEL CURVE TRACER

BACKGROUND OF THE INVENTION

The present invention relates to an apparatus and method for improving the presentation of information on a video display, and is particularly directed to an improved means and method for presenting and comparing data displayed on the faceplate of a cathode ray tube in graphic form.

In electrical testing perhaps the most common parameter monitored is the voltage-current (V-I) characteristic of the component or device. This parameter is generally derived by applying a changing voltage across the component, or a select portion of a device, and measuring the output current therefrom. The voltage is typically varied in a linear manner from 0 volts up to a predetermined, maximum voltage, and then reduced in a linear manner to the starting voltage. The output current is then measured and displayed.

The information thus displayed typically not only includes the performance of the device under test, but also the operation of a reference, or "ideal", device. Thus, two sets of data are displayed, from a comparison of which the operation of the device under test may be accurately determined. Frequently the graphical presentations of performance data for the two devices may closely approach one another and perhaps, at least partially, overlap. Thus, it may be difficult, if not impossible, to determine which device is associated with a particular performance curve. In some applications, this information may be critical for proper operation of the system in which the component or device is to be utilized.

Prior art systems provide for the comparison of a device under test with a known, good device by switching the CRT display from one device to the other and back again. The switching may be accomplished either manually or by timed-based automatic switching. In either case, a side-by-side comparison for more accurate evaluation is unavailable. In earlier displays, a chopper circuit is used to multiplex the two channel inputs for the simultaneous display of both sets of data. This, however, is of limited use where the data presentations are virtually identical and nearly completely overlapped.

The present invention is intended to overcome the aforementioned limitations of the prior art by providing a means and method for displaying and accurately comparing performance data in graphic form of an electrical component or device under test with that of a reference, or "ideal", component or device.

OBJECTS OF THE INVENTION

Accordingly, it is an object of the present invention to improve the presentation of graphic information displayed on a CRT, particularly for the case of two sets of closely spaced curves or data points.

It is another object of the present invention to provide an improved means and method for displaying electrical operating characteristics of two components or networks on a CRT.

A further object of the present invention is to provide an improved means and method for simultaneously displaying two sets of data in graphic form on a CRT where the sets of data can be individually identified regardless of the relative proximity of the locus of points defining each set of data.

Yet another object of the present invention is to provide an improved dual channel video display system for simultaneously displaying two sets of data in graphic form in a manner such that each data set can be easily distinguished from the other regardless of how close the respective graphs are located.

DESCRIPTION OF THE DRAWINGS

The appended claims set forth those novel features believed characteristic of the invention. However, the invention itself as well as further objects and advantages thereof, will best be understood by reference to the following detailed description of a preferred embodiment taken in conjunction with the accompanying drawings, in which:

DESCRIPTION OF THE PREFERRED EMBODIMENT

Figure 1:
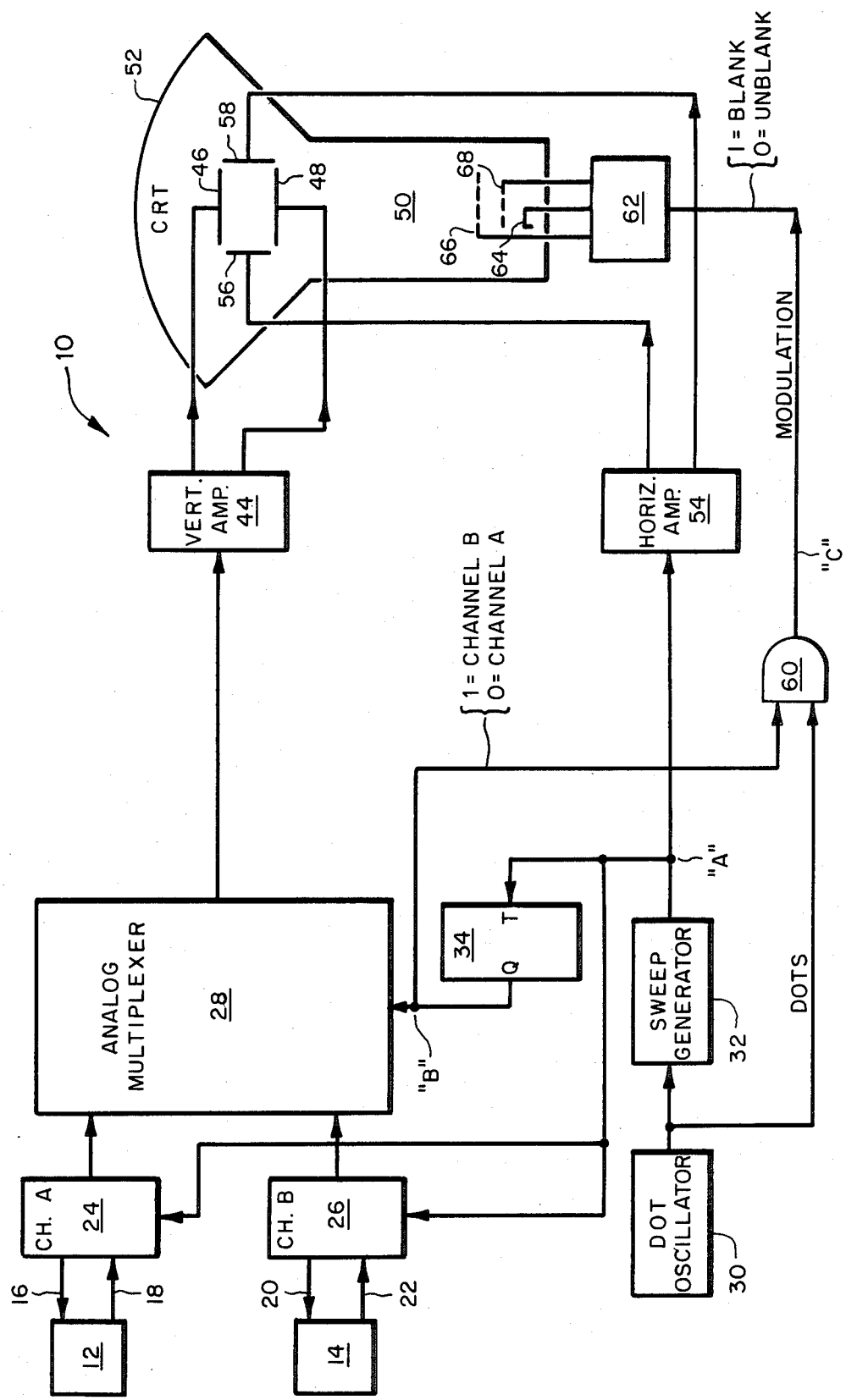
FIG. 1 is a combination schematic and block diagram of a dual channel curve tracer with Z-axis modulation in accordance with the present invention.

Referring to FIG. 1, there is shown in combination block and schematic diagram form a dual channel curve tracer 10 in accordance with the present invention.

Figure 2A:
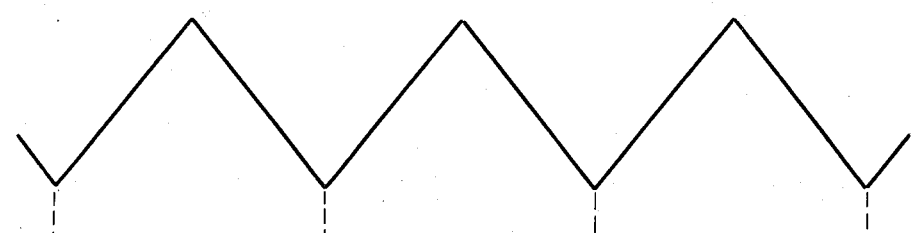
FIGS. 2A through 2C represent timing diagrams of the signals in various portions of the dual channel curve tracer of FIG. 1.

The dual channel curve tracer 10 permits the electrical performance of two devices or components 12, 14 to be measured and compared. In FIG. 1, element 12 represents a known, or reference, device which is used as a standard against which the operation of a device under test 14 is compared. Elements 12, 14 may be passive or active electrical/electronic components or devices. An input signal is applied to each of elements 12, 14 via respective lines 16, 20 from channel A and channel B circuits 24, 26. Typically, an input voltage is applied to each device from a respective channel, which input signal is cycled over a predetermined range of voltages so as to provide a range of output current values for that device. The output signals are provided via respective lines 18, 22 from devices 12, 14 to channel A and channel B circuits 24, 26. Channels A and B are conventional curve tracer circuits wherein an output signal is varied in a continuous, periodic manner over a predetermined range of values to permit the performance of a device under test 14 to be compared with a reference, or standard, device 12. The rate at which the output signals from channels A and B are varied is determined by a timing signal provided thereto from a sweep generator 32. Sweep generator 32 outputs a triangular-shaped linear output voltage, as shown in FIG. 2A, at point "A" in FIG. 1 which is cycled over a predetermined voltage range from a minimum to a maximum and back to a minimum voltage value. In response to this continuously varying input, reference device 12 and the device under test 14 will output via lines 18, 22, respectively, to channels A and B signals representing their operation over the range of the continuously varying input signal. Thus, a voltage-current (V-I) characteristic curve for each of the aforementioned devices 12, 14 is provided to a respective channel circuit 24, 26.

Figure 2B:
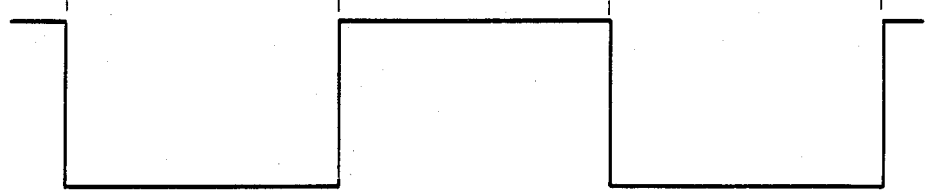

The outputs from channels A and B are provided to analog multiplexer 28. Also provided to multiplexer 28 via a flip-flop circuit 34 is the timing signal output from sweep generator 32 shown in FIG. 2A. Element 34 is a T-type flip-flop circuit which alternately changes state in response to successive cycles of the sweep signal provided thereto from sweep generator 32. The pulsed output from T-type flip-flop circuit 34 at point "B" in FIG. 1 is shown in FIG. 2B and is provided to analog multiplexer 28. As shown in FIG. 1, the outputs from channels A and B, respectively representing the performance of reference device 12 and the device under test 14, are also provided to analog multiplexer 28. Analog multiplexer 28 may take on a variety of specific implementations all within the knowledge and scope of one skilled in the art. For example, in a preferred embodiment analog multiplexer includes a diode switching arrangement for selectively gating either the output from channel A or the output from channel B through to a vertical amplifier 44 depending upon the pulsed output from flip-flop circuit 34. The alternating outputs from multiplexer 28 are converter by vertical amplifier circuit 44 to vertical deflection signals which are provided to vertical deflection plates 46, 48 within CRT 50 for vertically deflecting the electron beam therein across faceplate 52. It is in this manner that curves representing the operation of devices 12, 14 over a range of operating conditions are displayed on CRT 50. Thus, the operating characteristics of the device under test 14 may be visually compared with the operating characteristics of a reference, or "ideal", device 12.

Sweep generator 32 is driven by a high frequency "dot" oscillator 30 in a preferred embodiment of the present invention. Dot oscillator 30 is a square wave generator which may be a conventional multivibrator circuit and which, in a preferred embodiment, has an output frequency $\approx 100$ times the frequency of the sweep generator 32. Thus, dot oscillator 30 executes many cycles during one period of sweep generator 32. As described above, T-type flip-flop circuit 34 provides a pulsed output to point "B" which is connected to one input of AND gate 60. To the other input of AND gate 60 is provided the high frequency pulsed output of dot oscillator 30. AND gate 60 is enabled by the lower frequency, pulsed output from T-type flip-flop circuit 34 for gating the high frequency pulsed output of dot oscillator 30 to a Z-axis modulation circuit 62.

Figure 2C:
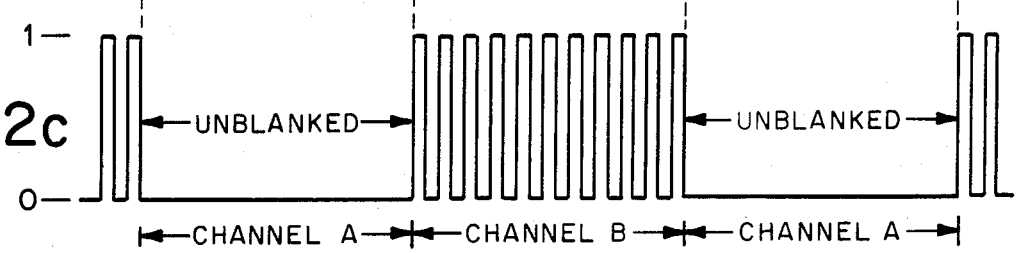

The output of AND gate 60 at point "C" in FIG. 1 is shown in FIG. 2C as a pulsed series of high frequency pulses from dot oscillator 30. An output pulse from T-type flip-flop circuit 34 not only enables analog multiplexer 28 in providing operating information regarding the device under test 14 to the vertical amplifier 44 and thence to the CRT 50, but also enables AND gate 60 through which the high frequency output of dot oscillator 30 is transmitted. Thus, an output of multiplexer circuit 28 from channel B is provided when the high frequency pulsed output of dot oscillator 30 is gated through AND gate 60. The pulsed, high frequency output of AND gate 60 is shown in FIG. 2C, where it can be seen that information from channel A is provided to CRT 50 during periods when the high frequency output of dot oscillator 30 is not provided via AND gate 60 to Z-axis controller 62, while during periods when data is provided from channel B to CRT 50, the high frequency output of dot oscillator 30 is provided via AND gate 60 to the Z-axis controller 62.

Z-axis controller 62 is thus modulated by the on/off, high frequency, pulsed output from AND gate 60 where a "1" provided to Z-Axis controller 62 results in a blanking of CRT 50, while the absence of an input pulse provided to Z-axis controller 62 causes CRT 50 to be unblanked. Z-axis controller 62 may be a conventional modulation circuit in design and is coupled, in a conventional manner, to the CRT's cathode 64 and first and second control electrodes, or grids, 66, 68. By providing the proper voltages to first and second control grids 66, 68 and an appropriate current in cathode 64, CRT 50 may be selectively blanked or unblanked under the control of the Z-axis controller 62. Where sweep generator 32 has a frequency f and dot oscillator 30 has a frequency nf, where n is an integer, Z-axis modulation of the electron beam will result in the output signal from channel B to the analog multiplexer 28 being displayed on CRT 50 in dotted line form. By changing the value of n, the size of the dots may be changed and by varying n, the thus modulated video signal may be changed from dotted line form to virtually any type of broken line image.

The sweep generator 32 provides the triangular sweep signal shown in FIG. 2A to a horizontal amplifier circuit 54. The periodic nature of the signal provided to the horizontal amplifier 54 allows it to selectively control the voltages applied to a pair of horizontal deflection plates 56, 58, to which it is coupled as shown in FIG. 1. Thus, in response to the triangular waveform output by sweep generator 32 and provided via horizontal amplifier 54 to the horizontal deflection plates 56, 58, the electron beam within CRT 50 is subjected to a periodic horizontal sweep and retrace across the faceplate 52 of CRT 50. The triangular waveform shown in FIG. 2A is converted to a sawtooth waveform within horizontal amplifier 54 in a conventional manner to provide the signal required for horizontal deflection of the electron beam within CRT 50.

Figure 3:
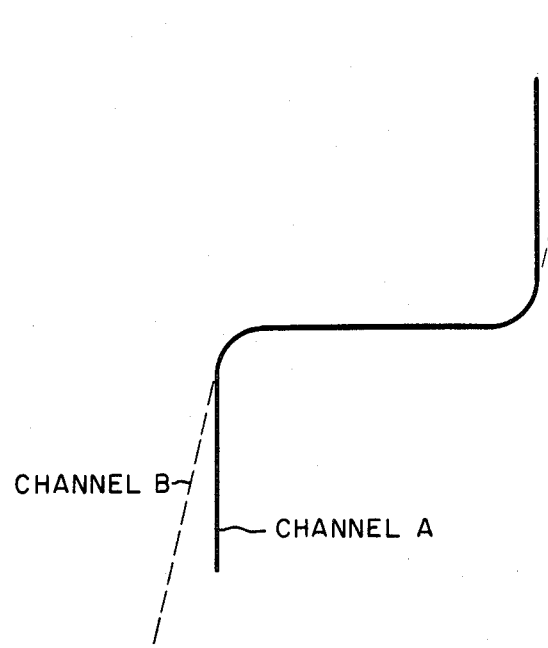
FIG. 3 illustrates the simultaneous video display of two sets of data presented on a CRT as provided for by the present invention.

Referring to FIG. 3, there is shown a typical V-I curve where voltage varies horizontally across FIG. 3, and the output current varies vertically in the figure. The current axis, where $I=0$, lies along the generally horizontal portion of the curves, while the voltage axis, where $V=0$, is generally positioned at the center of the aforementioned horizontal, overlapping portions of channels A and B. As explained above, the output from channel A would typically represent the performance of a reference device, while channel B represents the operation of a device under test. From FIG. 3, it can be seen that the Z-axis modulation of the electron beam in CRT 50 when data from channel B is displayed results in a dotted line presentation of that information which is easily distinguishable from the solid line presentation of channel A data. Thus, the performance of each device coupled to a respective channel is easily distinguishable on the faceplate of the CRT even where the performance of the device under test closely approaches that of the reference device and the two curves appear in close proximity with respect to one another.

There has thus been shown a dual channel curve tracer with Z-axis modulation which provides for the graphic display of the operating characteristics of two electrical/electronic components or networks. The respective performance characteristics of each device are presented in a manner such that both graphs are easily distinguishable even if they closely approximate one another, as where both components or networks have substantially the same operating characteristics. The present invention thus permits an accurate comparison on the faceplate of a CRT of a device under test with a reference, or standard, device.

While particular embodiments of the present invention have been shown and described, it will be obvious to those skilled in the art that changes and modifications may be made without departing from the invention in its broader aspects. Therefore, the aim in the appended claims is to cover all such changes and modifications as fall within the true spirit and scope of the invention. The matter set forth in the accompanying drawings is offered by way of illustration only and not as a limitation. The actual scope of the invention is intended to be defined in the following claims when viewed in their proper perspective based on the prior art.

I claim:

1. A system for measuring and comparing on the faceplate of a CRT having an electron beam incident thereon first and second output signals of first and second electronic components respectively generated in response to first and second input signals respectively provided thereto, said system comprising:

first timing means for generating a first periodic signal;

first and second channels coupled respectively to said first and second electronic components and to said timing means for generating periodically varying first and second input signals, providing said first and second input signals to said first and second electronic components respectively, and for receiving said first and second output signals in response thereto;

multiplexer means coupled to said CRT, to said first and second channels and to said timing means for receiving and alternately providing said first and second output signals to said CRT for simultaneously displaying said first and second output signals thereon during alternating cycles of said first periodic signal;

second timing means for generating a second periodic signal synchronous with said first periodic signal and having a higher frequency than said first periodic signal; and control means coupled to said CRT and to said first and second timing means for modulating said electron beam during alternating cycles of said first periodic signal in accordance with said second periodic signal such that the display on the faceplate of the CRT of said first output signal is visibly distinct from the display of said second output signal.

2. The system of claim 1 wherein the modulation by said control means comprises the periodic blanking and unblanking of said electron beam during alternating cycles of said first periodic signal at the frequency of said second periodic signal such that said first output signal is displayed in dotted line form.

3. The system of claim 1 wherein the voltage of said first and second input signals provided to said first and second electronic components is varied over one cycle of said first periodic signal and wherein said first and second output signals represent the respective currents in said first and second components generated in response to the periodically varying first and second input signals provided thereto.

4. The system of claim 1 wherein said first timing means includes a sweep generator outputting a periodic triangular waveform having a frequency f and wherein said second timing means comprises an oscillator having a frequency nf.

5. The system of claim 4 wherein the electron beam of the CRT is blanked and unblanked at a rate equal to the frequency of said oscillator.

6. The system of claim 1 further comprising a divide-by-two counter coupling said first timing means to said multiplexer means and to said control means for providing alternating operation of said multiplexer and control means during alternate cycles of said first periodic signal.

7. The system of claim 1 wherein said multiplexer means comprises an analog circuit for alternately providing said first and second output signals to said CRT during alternating cycles of said first periodic signal.

8. The system of claim 1 further comprising vertical amplification means coupling said multiplexer means to said CRT for the timed vertical deflection of the electron beam therein.

9. The system of claim 1 further comprising horizontal amplification means coupling the first timing means to said CRT for the timed horizontal deflection of the electron beam therein.

10. A method for measuring and comparing the operating characteristics of first and second devices on the faceplate of a CRT responsive to an electron beam incident thereon, wherein said operating characteristics are represented by respective first and second sets of data points on said faceplate, said method comprising:

providing a continuously varying input signal to said first and second devices;

detecting respective first and second output signals from said first and second devices generated in response to the input signal provided thereto;

alternately gating at a first frequency $f_1$ said first and second output signals to said CRT for display on the faceplate thereof; and intensity modulating the electron beam of said CRT at a frequency $f_2$ during the display of said second output signal, where $f_2 > f_1$.

11. A method as in claim 10 further comprising the step of synchronizing the continuous variation of said input signal provided to said first and second devices with the intensity modulation of the electron beam of said CRT.

12. A method as in claim 10 further comprising the step of deriving a gating signal at a frequency $f_1$ directly from a higher frequency signal having a frequency $f_2$.

* * * * *